United States Patent [19]
Heid et al.

[11] Patent Number: 5,541,514
[45] Date of Patent: Jul. 30, 1996

[54] METHOD FOR OPERATING A MAGNETIC RESONANCE IMAGING APPARATUS

[75] Inventors: Oliver Heid, Bern, Switzerland; Michael Deimling, Moehrendorf, Germany

[73] Assignee: Siemens Aktiengesellschaft, Munich, Germany

[21] Appl. No.: 510,358

[22] Filed: Aug. 2, 1995

[30] Foreign Application Priority Data

Aug. 3, 1994 [DE] Germany .......................... 44 27 497.1

[51] Int. Cl.$^6$ .................................................. G01R 33/48
[52] U.S. Cl. ............................................................ 324/309
[58] Field of Search ................................... 324/309, 307, 324/306, 312; 128/653.2

[56] References Cited

U.S. PATENT DOCUMENTS

| | | | |
|---|---|---|---|
| 4,769,603 | 9/1988 | Oppelt et al. | 324/304 |
| 4,825,159 | 4/1989 | Oppelt et al. | 324/309 |
| 5,019,784 | 5/1991 | Garwood et al. | 324/309 |
| 5,034,692 | 7/1991 | Laub et al. | 324/309 |
| 5,270,654 | 12/1993 | Feinberg et al. | 324/309 |
| 5,345,175 | 9/1994 | Kasuboski et al. | 324/309 |

*Primary Examiner*—Sandra L. O'Shea
*Assistant Examiner*—Raymond Y. Mah
*Attorney, Agent, or Firm*—Hill, Steadman & Simpson

[57] ABSTRACT

In a steady-state pulse sequence having a repetition time and a flip angle α with alternating polarity for operating a magnetic resonance imaging apparatus, the excursion of the magnetization in the steady-state condition moves between a first value +α/2 and a second value −α/2. Before the beginning of the pulse sequence, a radiofrequency pulse having a flip angle α/2 is emitted before the first excitation pulse. The steady-state condition is thus reached earlier and a spin preparation can be implemented which is still effective when imaging data are acquired.

5 Claims, 4 Drawing Sheets

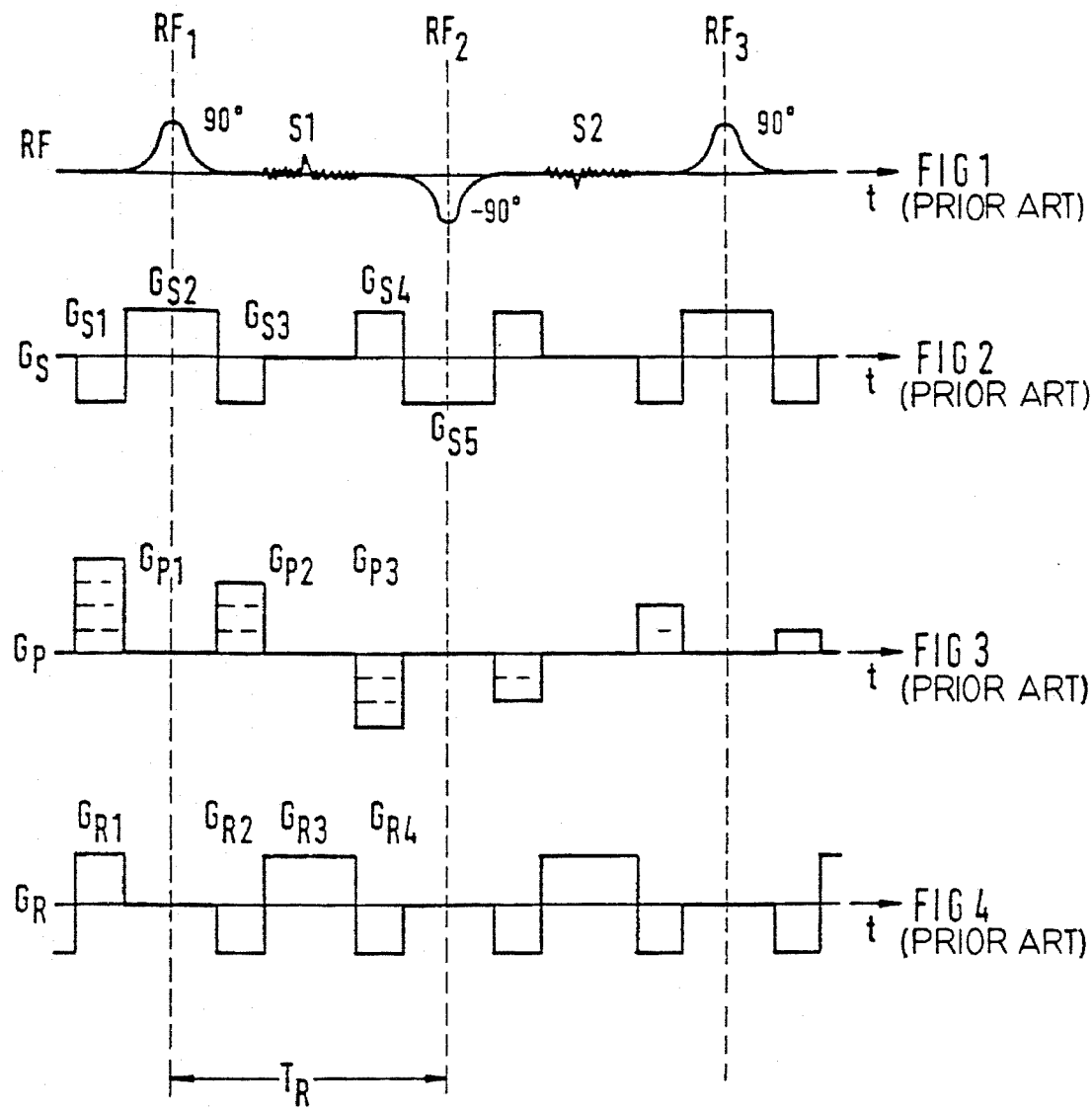

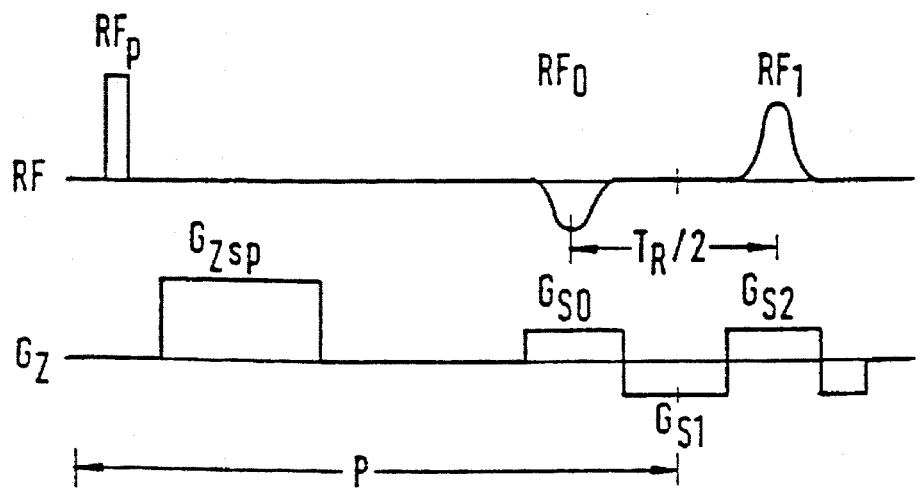
FIG 5
FIG 6
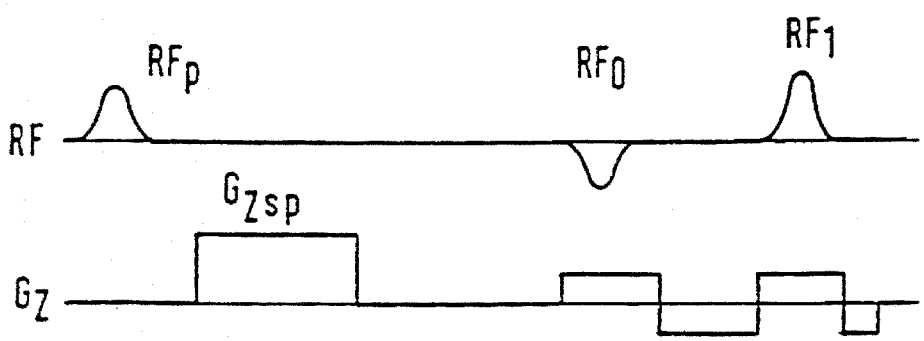
FIG 11
FIG 12
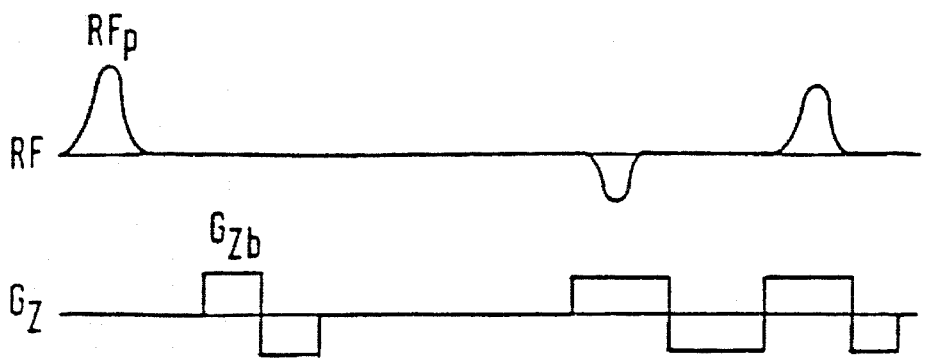
FIG 13
FIG 14

METHOD FOR OPERATING A MAGNETIC RESONANCE IMAGING APPARATUS

BACKGROUND OF THE INVENTION

1. Field of the Invention

The present invention is directed to a method, in the form of a pulse sequence for operating a magnetic resonance imaging (nuclear magnetic resonance tomography) apparatus.

2. Description of the Prior Art

A pulse sequence is disclosed, for example, in U.S. Pat. No. 27,769,603 and is usually referred to by the acronym "FISP". For explaining a problem associated with this known method, an exemplary embodiment of the method disclosed in this patent is shown in FIGS. 1 through 4 herein. Each sub-sequence of this known method begins in a time segment I with a radiofrequency excitation pulse $RF_1$ that has a flip angle of 90°. The radiofrequency pulse $RF_1$ is frequency-selective and is emitted in the presence of a slice-selection gradient GS2, so that only a selected slice of the examination subject is excited. In a time segment II, a dephasing of the nuclear magnetization in the read-out direction ensues by means of a gradient $G_{R2}$. In the time segment II, further, a phase-coding gradient pulse $G_{P2}$ as well as a gradient pulse $G_{S3}$ directed oppositely to the slice-selection gradient pulse $G_{S2}$ are activated. As a result of the gradient pulse $G_{S3}$, the dephasing caused by the slice-selection gradient pulse $G_{S2}$ is compensated.

In a time segment III, a read-out gradient pulse $G_{R3}$ is activated and thus a rephasing of the nuclear spins is achieved, so that a nuclear magnetic resonance signal S1 arises. This nuclear magnetic resonance signal S1 is sampled and is employed in a conventional manner for producing an image.

In a time segment IV, a slice-selection gradient pulse $G_{S4}$ in the positive slice-selection direction, a gradient pulse $G_{P3}$ opposite the gradient pulse $G_{P2}$ and a gradient pulse $G_{R4}$ in the negative read-out direction are activated.

In a time segment V, a radiofrequency pulse $RF_2$ having a flip angle of −90° is activated in the presence of a slice-selection gradient pulse $G_{S5}$ in the negative slice-selection direction. A new read-out interval is thus initiated. The illustrated pulse sequence is repeated n times with different values of the phase-coding gradient pulses $G_{P2}$. The phase relation of the radiofrequency excitation pulse is thus inverted from pulse sequence-to-pulse sequence, so that the operational signs of the flip angles effected by the excitation pulse RF alternate. The spacing between two successive radiofrequency excitation pulses RF is referenced $T_R$ (repetition time). All gradients are switched such that their time integral over a repetition time $T_R$ yields zero.

A fast imaging is possible with this method since the repetition time $T_R$ can be made significantly shorter than the relaxation times T1 and T2.

In the illustrated pulse sequence, the magnetization is brought to 90° by the first radiofrequency excitation pulse $RF_1$ and to about 0° by the second radiofrequency excitation pulse $RF_2$, so that only every other radiofrequency excitation supplies a transient signal. A steady-state condition, wherein the flip angle moves between plus and minus 45°, is achieved only after a transient that lies roughly on the order of magnitude of T1 or T2. Until this steady state has been achieved, the nuclear magnetic resonance signal oscillates significantly and cannot be interpreted in practice.

Apart from the lost time for the signal acquisition that is caused by this transient, it also causes another disadvantage. In many instances, a preparation of the nuclear spins is desired, for example for influencing the contrast behavior or for suppressing specific spectral ranges. The effect of such a preparation, however, decays with the longitudinal or transverse relaxation time T1 or T2. Since a steady-state condition has not yet been established within this time given the illustrated FISP sequence, it is precisely the signals affected by the preparation that cannot be utilized.

SUMMARY OF THE INVENTION

An object of the invention is to shorten the transient time in a pulse sequence of the type described above and thereby to permit a preparation of the spins to still be effective in the subsequently acquired signals.

The above object is achieved in accordance with the principles of the present invention in a method for operating a magnetic resonance imaging apparatus wherein, before the beginning of a pulse sequence of the FISP type as described above, a radiofrequency pulse is emitted having a flip angle which is one-half of the flip angle of the first excitation pulse of the FISP sequence, and having a phase relation inverted relative thereto, this radiofrequency pulse being emitted at a time before the first excitation pulse of the FISP sequence which is one-half of the repetition time of the FISP sequence.

DESCRIPTION OF THE DRAWINGS

FIGS. 1–4, has noted above, illustrate a known FISP sequence for operating a magnetic resonance imaging apparatus.

FIGS. 5 and 6 illustrate a first exemplary embodiment of a spin preparation sequence in accordance with the principles of the present invention.

FIGS. 11 and 12 illustrate a second exemplary embodiment of a spin preparation sequence in accordance with the principles of the present invention.

FIGS. 13 and 14 illustrate a third exemplary embodiment of a spin preparation sequence in accordance with the principles of the present invention.

DETAILED DESCRIPTION OF THE PREFERRED EMBODIMENTS

According to the pulse sequence of FIGS. 5 and 6, a radiofrequency pulse $RF_0$ is emitted in a preparation phase P preceding the first radiofrequency pulse $RF_1$ of the pulse sequence set forth above with reference to FIGS. 1–4. The radiofrequency pulse $RF_0$ is frequency-selective and is emitted in the presence of a slice-selection gradient $G_{S0}$, so that only one slice of the examination subject is excited. The dephasing caused by the slice-selection gradient $G_{S0}$ is cancelled by the oppositely directed gradient $G_{S1}$.

The radiofrequency pulse $RF_0$ has a flip angle that produces an excursion of the magnetization corresponding to that established in the steady-state condition of the following pulse sequence. In the present example (radiofrequency excitation pulses RF alternate between +90° and −90° flip angle), the radiofrequency pulse $RF_0$ will thus have a flip angle of −45°. In general, the magnetization vector given excitation pulses of ±α oscillates between +α/2 and −α/2 and the radiofrequency pulse $RF_0$ must then have a flip angle of 2/2 with a phase relation inverted relative to the following radiofrequency excitation pulse $RF_1$. The spin system thus reaches in the equilibrium condition significantly faster in comparison to the use of the sequence of FIGS. 1–4 by itself and the amplitude fluctuations in the transients are significantly less.

Figure 7:
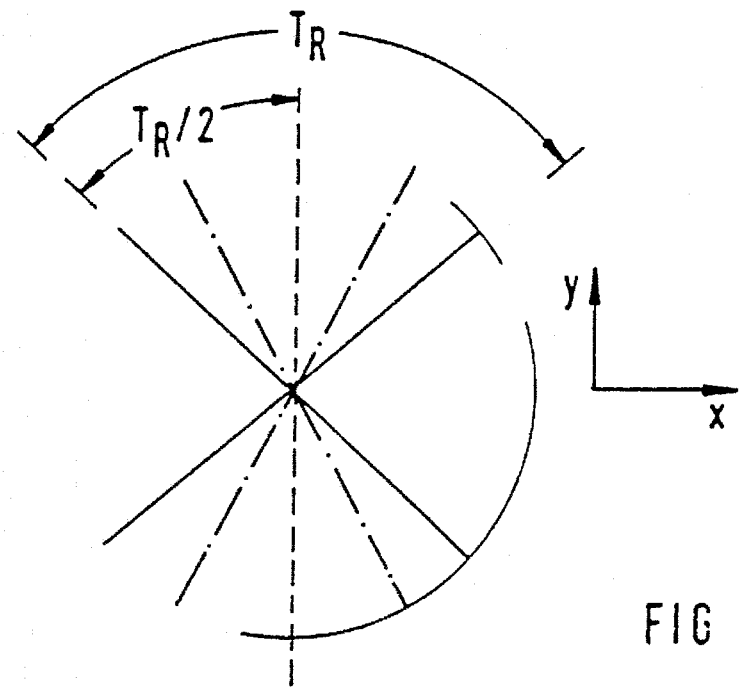
FIG. 7 illustrates the phase relation of off-resonant spins in the rotating coordinate system.
Figure 8:
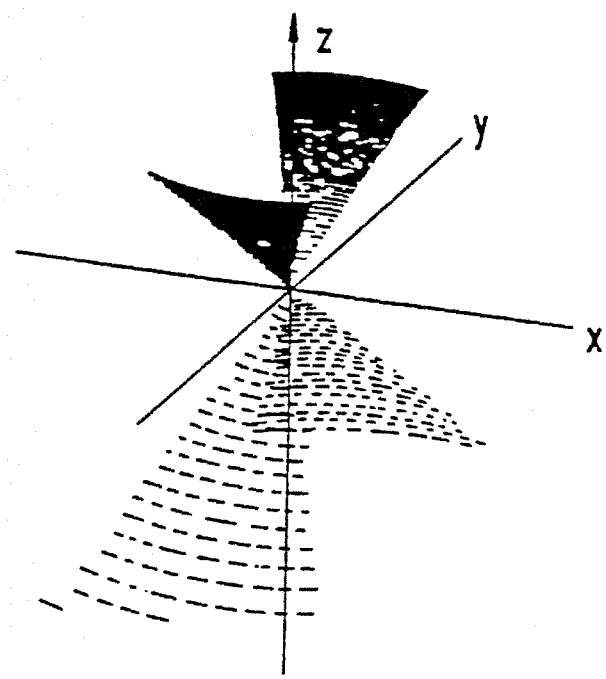
FIG. 8 illustrates the spatial position of the spin vectors in the slightly off-resonant condition.

The phase of slightly off-resonant spins, however, must also be considered with respect to the excitation pulse $RF_0$. Off-resonant spins cannot be ignored since certain basic field inhomogeneities or susceptibility changes are always present within the excited slice. The phase-relation of off-resonant spins in a rotating coordinate system is schematically shown in FIG. 7. The on-resonant condition is thereby shown with a dashed line, the dot-dash line shows the limits of the phase deviation of specific off-resonant spins, the solid line shows the limits of the phase deviation of highly off-resonant spins. The lower half of the diagram of FIG. 8 shows the conditions for negative flip angles.

The largest phase deviation occurs in the excitation of the nuclear spins. The phase angle oscillates around the on-resonant condition with a period that is equal to the repetition time $T_R$. After a time $T_R/2$, all spins pass through the on-resonant condition.

Figure 9:
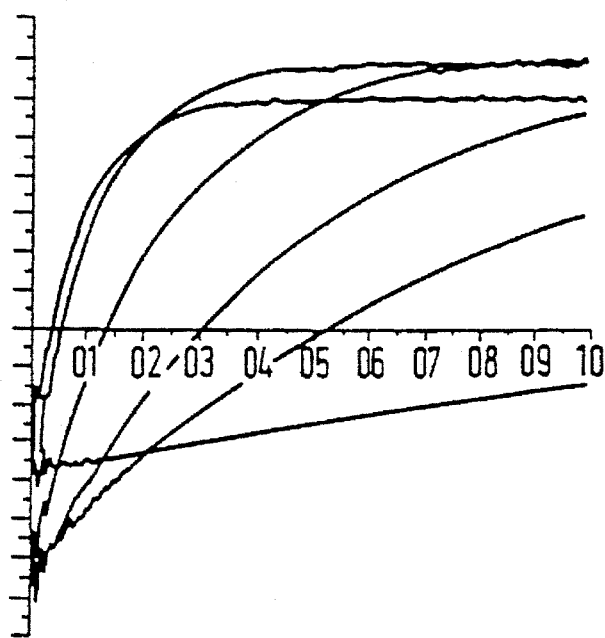
FIGS. 9 and 10 illustrate the transience of the signal amplitude for various relationships T1/T2.

This fact is utilized in the pulse sequence according to FIG. 5 in that the radiofrequency pulse $RF_0$ is emitted at a time $T_R/2$ before the radiofrequency pulse $RF_1$. At the point in time of the excitation by the radiofrequency pulse $RF_1$, all nuclear spins that are excited by the radiofrequency pulse $RF_0$ are thus in phase with this excitation pulse. The position of the vectors that describe the magnetization position of the nuclear spins in a rotating coordinate system is schematically shown in FIG. 9.

If it is assumed that the pulse sequence is operated with alternating flip angles of +α,−α and a repetition time $T_R$, then, taking the radiofrequency pulse $RF_0$ into consideration, the following sequence derives:

$$(-\alpha/2)T_R/2[(\alpha)T_R(-\alpha)T_R]_N.$$

Due to the faster transient response to the steady-state condition, the nuclear magnetization can be prepared in a preparation phase P before the actual pulse sequence. For example, the known inversion recovery method can thereby be applied. For preparation, a 180° radiofrequency pulse $RF_P$ is thereby first emitted, this flipping the magnetization of the spins. The spins in turn relax after the 180° radiofrequency pulse $RF_P$, with a relaxation time $T_1$ corresponding to the respective tissue. The actual read-out sequence begins after a certain waiting time that is selected such that high contrast arises between tissues with different $T_1$ relaxation times. The phase coherency of the spins excited by the 180° radiofrequency pulse $RF_P$ is destroyed by a spoiler gradient $G_{zSp}$, i.e. by a strong gradient in, for example, the slice-selection direction.

Figure 10:
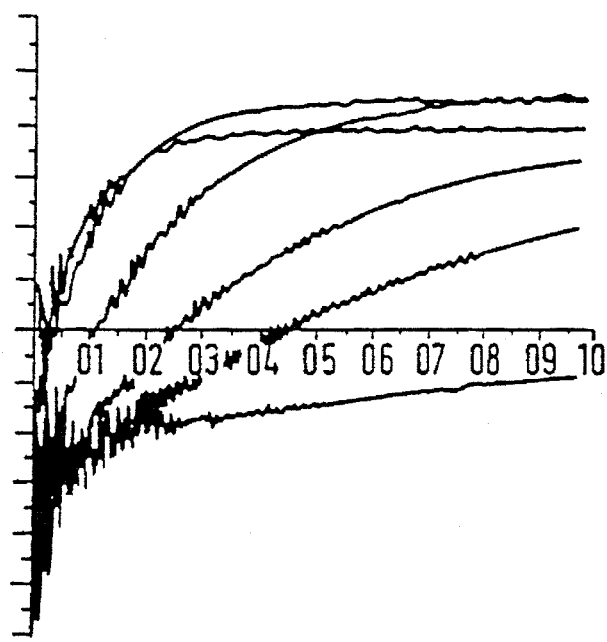

FIG. 9 shows the measured curve of the y-component of the magnetization (operational-sign-corrected in view of the preceding radiofrequency excitation pulse) for an inversion-recovery method according to FIGS. 5 and 6. For comparison, FIG. 10 shows the curve of the y-component of the magnetization in an inversion-recovery sequence without the radiofrequency pulse $RF_0$ with the flip angle α/2. The different curves correspond to different relaxation times $T_1$. The signal strength of the nuclear magnetic resonance signals that is obtained is proportional to this y-component. It is thereby clear that, according to FIG. 9, the signal strength oscillates significantly less than given a sequence without the inventive preparation.

As a further possible application, FIGS. 11 and 12 show the saturation of a spectral component of the examination subject. A spectrally selective radiofrequency saturation pulse $RF_P$ having a flip angle of 90° is thereby first emitted and this selectively saturates the nuclear spins of, for example, fatty tissue. The phase coherency of the saturated nuclear spins is destroyed by a strong spoiler gradient $G_{zSp}$ in, for example, the slice-selection direction. This presaturation results in no signal being received from the selectively saturated tissue, i.e., from the fatty tissue in this case.

In the applied example of FIGS. 13 and 14, an excitation pulse $RF_P$ is followed by a bipolar gradient $G_{zb}$. In this bipolar gradient, the positive and negative areas are equal, so that it has no influence on stationary spins. By contrast, the phase of moving spins is influenced by such bipolar gradients, as is known. Such a preparation sequence can thus be employed, for example, in angiography.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance imaging apparatus, comprising the steps of:

(a) exciting nuclear spins in an examination subject by emitting an excitation pulse having a flip angle α≦90° and having a phase associated therewith;

(b) emitting first gradient pulses including a first gradient pulse in a first direction and a first gradient pulse in a second direction perpendicular to said first direction;

(c) reading out nuclear magnetic signals arising in said subject by emitting a second gradient pulse in said first direction and having an opposite operational sign with respect to said first gradient pulse in said first direction;

(d) rephasing said nuclear spins by emitting further gradient pulses including a further gradient pulse in said first direction and a further gradient pulse in said second direction;

(e) repeating steps (a), (b), (c), and (d) with a repetition time $T_R$ with a different first gradient pulse in said second direction in each repetition and with an alternating operational sign of said flip angle thereby causing an inversion of the phase relation of the respective excitation pulses in successive repetitions of step (a), and thereby establishing a steady-state condition wherein the magnetization of the nuclear spins moves approximately between +α/2 and −α/2; and (f) emitting a radiofrequency pulse, before step (a) of each repetition, having a flip angle α/2 and a phase relation which is inverted relative to said excitation pulse in step (a), at a time of $T_R/2$ before said excitation pulse in step (a).

2. A method as claimed in claim 1 comprising the additional step of preparing said nuclear spins before emitting said radiofrequency pulse in step (e).

3. A method as claimed in claim 2 wherein the step of preparing said nuclear spins comprises emitting a radiofrequency pulse having a flip angle of 180°.

4. A method as claimed in claim 2 wherein the step of preparing said nuclear spins comprises emitting a radiofrequency pulse followed by a bipolar gradient having a gradient-time integral of zero.

5. A method as claimed in claim 2 wherein the step of preparing said nuclear spins comprises saturating a selected spectral range of nuclear spins by emitting a selective radiofrequency pulse followed by a spoiler gradient.

* * * * *